United States Patent
Fulford, Jr. et al.

(10) Patent No.: US 6,258,646 B1
(45) Date of Patent: Jul. 10, 2001

(54) CMOS INTEGRATED CIRCUIT AND METHOD FOR IMPLANTING NMOS TRANSISTOR AREAS PRIOR TO IMPLANTING PMOS TRANSISTOR AREAS TO OPTIMIZE THE THERMAL DIFFUSIVITY THEREOF

(75) Inventors: H. Jim Fulford, Jr., Austin; Mark I. Gardner, Cedar Creek; Derick J. Wristers, Austin, all of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/149,631

(22) Filed: Sep. 8, 1998

Related U.S. Application Data

(62) Division of application No. 08/760,462, filed on Dec. 6, 1996, now Pat. No. 5,844,276.

(51) Int. Cl.$^7$ .................. H01L 21/8238; H01L 29/76; H01L 29/94; H01L 31/062; H01L 31/113
(52) U.S. Cl. .................. 438/231; 438/230; 438/232; 438/217; 257/336; 257/344
(58) Field of Search .................. 438/231, 230, 438/232, 229, 217; 257/336, 344

(56) References Cited

U.S. PATENT DOCUMENTS

| 4,745,086 | * | 5/1988 | Parrillo et al. | 437/57 |
|---|---|---|---|---|
| 4,753,898 | * | 6/1988 | Parrillo et al. | 437/44 |
| 4,769,686 | * | 9/1988 | Horiuchi et al. | 357/23.8 |
| 5,015,595 | * | 5/1991 | Wollesen | 437/31 |
| 5,434,440 | * | 7/1995 | Yoshitomi et al. | 257/344 |
| 5,472,887 | * | 12/1995 | Hutter et al. | 437/34 |
| 5,491,099 | * | 2/1996 | Hsu | 437/35 |
| 5,498,556 | * | 3/1996 | Hong et al. | 437/35 |
| 5,527,722 | * | 6/1996 | Hutter et al. | 437/34 |

FOREIGN PATENT DOCUMENTS 0 456 318 A2 * 11/1991 (EP).

* cited by examiner

Primary Examiner—Wael Fabarry
Assistant Examiner—Neal Berezny
(74) Attorney, Agent, or Firm—Kevin L. Daffer; Conley, Rose & Tayon P.C.

(57) ABSTRACT

A transistor and a transistor fabrication method for forming an LDD structure in which the n-type dopants associated with an n-channel transistor are formed prior to the formation of the p-type dopants is presented. The n-type source/drain and LDD implants generally require higher activation energy (thermal anneal) than the p-type source/drain and LDD implants. The n-type arsenic source/drain implant, which has the lowest diffusivity and requires the highest temperature anneal, is performed first in the LDD process formation. Performing such a high temperature anneal first ensures minimum additional migration of subsequent, more mobile implants. Mobile implants associated with lighter and less dense implant species are prevalent in LDD areas near the channel perimeter. The likelihood of those implants moving into the channel is lessened by tailoring subsequent anneal steps to temperatures less than the source/drain anneal step.

13 Claims, 4 Drawing Sheets

CMOS INTEGRATED CIRCUIT AND METHOD FOR IMPLANTING NMOS TRANSISTOR AREAS PRIOR TO IMPLANTING PMOS TRANSISTOR AREAS TO OPTIMIZE THE THERMAL DIFFUSIVITY THEREOF

CONTINUING APPLICATION INFORMATION

The captioned application is a divisional application from prior application Ser. No. 08/760,462, filed Dec. 6, 1996, now U.S. Pat. No. 5,844,276.

BACKGROUND OF THE INVENTION

1. Field of the Invention

This invention relates to semiconductor processing and, more particularly, to a method of forming a lightly doped drain structure in which implants associated with an n-channel transistor implants are formed prior to implants associated with a p-channel transistor.

2. Description of Relevant Art

Fabrication of a metal-oxide-semiconductor ("MOS") transistor is well-known. Fabrication begins by lightly doping a single crystal silicon substrate as either n-type or p-type. The specific area where the transistor will be formed is then isolated from other areas on the substrate with the use of isolation structures. In modern fabrication technologies, the isolation structures may comprise shallow trenches in the substrate filled with dielectric oxide which acts as an insulator. Isolation structures may alternatively comprise, for example, locally oxidized silicon ("LOCOS") structures well known in the art. A gate dielectric may be formed by oxidizing the silicon substrate. Oxidation is generally performed in a thermal oxidation furnace or, alternatively, in a rapid thermal anneal ("RTA") apparatus. A gate conductor is then patterned from a layer of polycrystalline silicon ("polysilicon") deposited on the gate dielectric. The polysilicon is rendered conductive by doping it with ions from an implanter or a diffusion furnace. The gate conductor is patterned using a mask followed by exposure, development, and etching. Subsequently, source and drain regions are doped, via ion implantation, with a high dosage n-type or p-type dopant. If the source and drain regions are doped n-type, the transistor is referred to as NMOS, and if the source and drain regions are doped p-type, the transistor is referred to as PMOS. A channel region between the source and the drain is protected from the implant species by the pre-existing gate conductor. When voltage above a certain threshold is applied to the gate of an enhancement-mode transistor, the channel between the source and drain becomes conductive and the transistor turns on.

NMOS remained the dominant MOS technology as long as the integration level of devices on a chip was sufficiently low. It is somewhat inexpensive to fabricate, NMOS integrated circuits which are functionally dense, and faster than PMOS integrated circuits. NMOS logic gates (i.e., inverters) draw DC power during one of the inverter states. Therefore, an NMOS integrated circuit will draw a steady current even when being operated in the standby mode (i.e., even when no signal is being propagated through the circuit). During the modem VLSI era, power consumption in NMOS circuits began to exceed tolerable limits. A lower power technology was needed to exploit the VLSI techniques. Complimentary MOS ("CMOS") represented such a technology. CMOS integrated circuits use a combination of an NMOS transistor with a PMOS transistor. Therefore, in a CMOS inverter (unlike in an NMOS inverter) only one of the two transistors is driven at any one time. This means that when a CMOS inverter is not switching from one state to the other, a high impedance path exists from the supply voltage to ground, regardless of the state the inverter is in. Hence, virtually no current flows, and almost no DC power is dissipated through the CMOS inverter. CMOS thus allows the manufacture of circuits with standby power on the order of microwatts.

As device dimensions are reduced while supply voltages remain constant (or are not reduced as rapidly as the structures are scaled), the maximum electric field $E_m$ becomes more isolated near the drain side of the channel causing accelerated inversion-layer charges (or carriers) to enter into the overlying gate oxide. The carriers become trapped in the gate dielectric, a phenomenon generally called the hot-carrier effect. The injection of hot carriers into the gate dielectric damages the substrate/gate dielectric interface. Over time, operational characteristics of the device may degrade due to this damage, that degradation resulting in, e.g., improper variation of threshold voltage, linear region transconductance, subthreshold slope, and saturation current. This may eventually reduce the lifetime of the devices. As a result, several techniques have been developed to combat hot-carrier injection problems.

One set of methods involves making the gate dielectric and/or the gate substrate/dielectric interface more resistant to hot carriers. This may be accomplished by developing dielectric films that exhibit fewer oxide trapping centers and interface state traps. Reducing charge trapping opportunities, however, has given way to simply reducing $E_m$. Reducing $E_m$ in the drain-side of the channel is a popular way to control the hot-carrier effect. A common approach to reducing $E_m$ is to minimize the abrupt voltage changes near the drain side of the channel. Disbursing abrupt voltage changes reduces $E_m$ strength and the harmful hot-carrier effects resulting therefrom.

Reducing $E_m$ occurs by replacing an abrupt drain doping profile with a more gradually varying doping profile. A more gradual doping profile distributes $E_m$ along a larger lateral distance so that the voltage drop is shared by the channel and the drain. Absent a gradual doping profile, an abrupt junction can exist where almost all of the voltage drop occurs across the lightly-doped channel.

The simplest method to obtain a gradual doping at the drain-side channel is to use a dopant with a high diffusivity, for example, phosphorus instead of arsenic for an n-channel device. The faster-diffusing phosphorus readily migrates from its implant position in the drain toward the channel creating a gradually doped drain and consequently a smoother voltage profile. However, the high diffusivity of phosphorus, in addition to creating a gradual lateral doping profile, also increases the lateral and vertical extents of the source and drain. Enlarging the source/drain junctions may bring about harmful short-channel effects and/or parasitic capacitances. Short-channel effects may result in less well-predicted threshold voltage, larger subthreshold currents, and altered I–V characteristics.

The most widely-used device structure for achieving a doping gradient at the drain-side of channel is the lightly-doped drain ("LDD"). An LDD structure is made by a two-step implant process. The first step takes place after the formation of the gate. For an n-channel device, a relatively light implant of phosphorus is used to form the lightly doped region adjacent the channel (i.e., the LDD implant). The LDD implants are also referred to as N⁻ and P⁻ implants because of their lower concentrations. A conformal CVD oxide film is then deposited over the LDD implant and interposed gate. The oxide is partially removed using an anisotropic dry-etch process. Anisotropic etch removes oxide in the substantially horizontal regions, leaving what are known as "spacers" on the sides of the gate. After the oxide spacers are formed, a second implant takes place at a higher dosage than the first implant. The second implant is chosen to use the same implant "type" (i.e., n or p) as the first. The higher concentration source/drain implant are also referred to as N+ and P+ implants. The source/drain implant is masked from areas adjacent the gate by virtue of the pre-existing spacers. Using an n-type example, the first implant may use phosphorus, while the second uses arsenic. The spacers serve to mask the arsenic and to offset it from the gate edges. By introducing spacers after the LDD implant, the LDD structure offers a great deal of flexibility in doping the LDD area relative to the source/drain area. The LDD area is controlled by the lateral spacer dimension and the thermal drive cycle, and is made independent from the source and drain implant (second implant) depth. The conventional LDD process, however, sacrifices some device performance to improve hot-carrier resistance. For example, the LDD process exhibits reduced drive current under comparable gate and source voltages.

A thermal anneal step is required after ion implantation in order to diffuse and activate the implanted ions and repair possible implant damage to the crystal structure. An anneal can occur in a furnace or the more modern rapid thermal anneal ("RTA") chamber. An RTA process is typically performed at 420–1150° C. and lasts anywhere from a few seconds to a few minutes. Large area incoherent energy sources were developed to ensure uniform heating of the wafers and to avoid warpage. These sources emit radiant light which allows very rapid and uniform heating and cooling. Wafers are thermally isolated so that radiant (not conductive) heating and cooling is dominant. Various heat sources are utilized, including arc lamps, tungsten-halogen lamps, and resistively-heated slotted graphite sheets. Most heating is performed in inert atmospheres (argon or nitrogen) or vacuum, although oxygen or ammonia for growth of silicon dioxide and silicon nitride may be introduced into the RTA chamber.

The temperature and time required for an RTA are tailored to the implant type and to the reasons for the implant. Dopants with a high diffusivity require lower anneal temperatures to activate and position the dopants. Dopants with a low diffusivity require higher anneal temperatures. In addition, higher concentrations of the dopants require higher anneal temperatures. Furthermore, the dopants used for the LDD implants require lower temperature anneals since any additional migration of these dopants is especially harmful. Any migration towards the channel will contribute to short-channel effects and any vertical migration will increase the parasitic capacitance. It would thus be advantageous to be able to form the LDD implants at an appropriate time relative to the source/drain implants so as to be able to better control the thermal anneal. In a conventional LDD, the LDD implants are performed first. However, any subsequent thermal anneal to activate and diffuse the source/drain implants will also thermally affect the LDD implants. The temperatures used to anneal the source/drain implants will also effect the pre-existing LDD implants. Migration of LDDs into the channel resulting from the source/drain anneal should be avoided if channel integrity is to be sustained.

SUMMARY OF THE INVENTION

The problems outlined above are in large part solved by a transistor and a transistor fabrication method in which the n-type implants associated with the n-channel transistor, which typically require high temperature thermal anneals, are performed prior to the p-type implants associated with the p-channel transistor, which typically require lower temperature thermal anneals. In addition: the n-type source/drain implant, typically low diffusivity arsenic requiring high temperature anneals, is performed before the n-type LDD implant which is more temperature sensitive, typically higher diffusivity phosphorus; and, the p-type source/drain implant is performed prior to the more temperature sensitive p-type LDD implant. Performing such a high temperature anneal first, prior to the other higher diffusivity implants, ensures minimum additional migration of the subsequent LDD implants.

In a conventional LDD, the LDD implants are performed first, prior to the source/drain implants. The LDD implants, especially the p-type boron implants, require a relatively low temperature anneal because of their high diffusivity. The source/drain implants require a higher thermal anneal temperature since the implant species are larger and often need to diffuse a longer distance. The n-type arsenic source/drain implants require an especially high temperature due to its relatively large atomic mass and commensurate low diffusivity. During the high temperature thermal anneal, the LDD implants that are already present will migrate significantly. Lateral migration towards the channel will shorten the channel length and cause short-channel effects, and vertical migration into the substrate will cause an increase of the parasitic capacitance. The current invention reverses the formation process to avoid such problems. The n-type arsenic source/drain implant is performed first, and the p-type LDD implant is performed towards the end of the process.

A semiconductor substrate is provided and first and second gate conductors are formed upon respective channel areas of the semiconductor substrate. First and second gate conductors are patterned from a layer of polysilicon. Spacers are then patterned on the sidewall surfaces of the first and second gate conductors. A dielectric material is deposited across first and second gate conductors and removed anisotropically so as to form the spacers on the sidewall surfaces of the first and second gate conductors. In a preferred embodiment, the dielectric spacers comprise silicon oxide. Alternatively, dielectric spacers may comprise silicon nitride or polysilicon. If the spacers comprise polysilicon an etch-stop layer is first grown upon the semiconductor topography. An N-type species of a first concentration, preferably comprising arsenic, is then implanted into the semiconductor topography a spaced distance from only the first channel area. Subsequently, the semiconductor topography is annealed at a first temperature. The spacer dielectrics are then removed from the sidewall surfaces of both the first and second gate conductors and an n-type species of a second concentration, less than the first concentration and preferably comprising phosphorus, is implanted into the semiconductor topography substantially adjacent only to the first channel area. A P-type species of a third concentration, preferably comprising boron, is implanted into the semiconductor topography substantially adjacent only to the second channel area. Another set of spacers is then patterned on the sidewall surfaces of the first and second gate conductors and a p-type species of a fourth concentration, greater than the third concentration and preferably comprising boron, is implanted into the semiconductor topography a spaced distance from only the second channel area. The semiconductor topography is finally annealed at a second temperature less than the first temperature. An optional thermal anneal, at a third temperature less than the first temperature, may be performed after implanting the second concentration of n-type species. An additional optional anneal, at a fourth temperature less than the third temperature, may be performed after implanting the third concentration of p-type species.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 1:
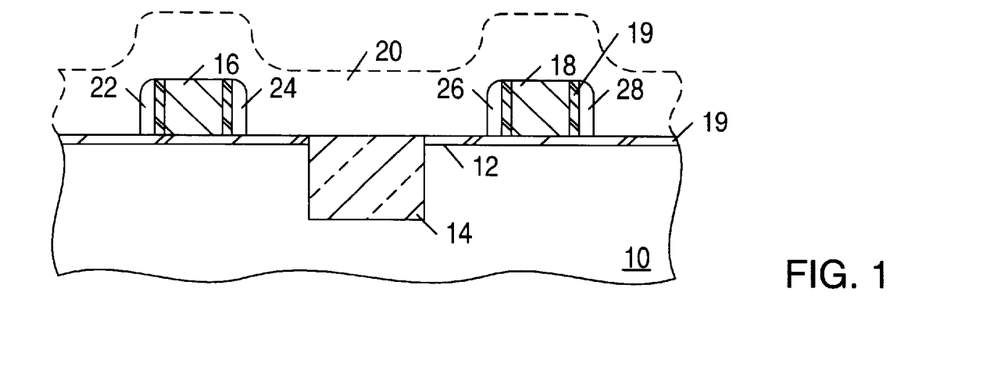
FIG. 1 is a partial cross-sectional view of a semiconductor topography showing two gate conductors formed a certain lateral distance apart with spacers formed on the dielectric-covered, sidewall surfaces of the gate conductors.

Turning now to the drawings, FIG. 1 is a partial cross-sectional view of semiconductor substrate 10 with an upper surface 12. Semiconductor substrate 10 preferably comprises lightly doped n-type or p-type single-crystalline silicon having a resistivity suitably in the range near 12 Ω-cm. Isolation structure 14 is then formed in the field region of semiconductor substrate 10. Isolation structure 14 is shown here as a shallow trench filled with a dielectric material, but it may alternatively comprise a LOCOS type isolation structure. Subsequently, a polysilicon layer is deposited a dielectric distance above upper surface 12 of semiconductor substrate 10 and then patterned to form first gate conductor 16 and second gate conductor 18 a spaced distance from opposing sides of isolation structure 14. Conformal dielectric layer 20 is then deposited upon the semiconductor topography. In a preferred embodiment, conformal dielectric layer 20 comprises decomposed TEOS deposited by a chemical vapor deposition ("CVD") process. This produces a film with excellent conformality. An anisotropic etch is then applied to remove dielectric at a faster rate along the horizontal surfaces than the vertical surfaces. The anisotropic etch removes the oxide in the substantially horizontal regions while leaving spacers on the sidewall surfaces of gate conductors 16 and 18. Oxide spacers 22 and 24 are formed on the sidewalls of gate conductor 16, and oxide spacers 26 and 28 are formed on the sidewalls of gate conductor 18. In an alternative embodiment, dielectric spacers 22, 24, 26, and 28 may comprise nitride or polysilicon patterned from a CVD nitride or polysilicon layer. In an embodiment where the dielectric spacers comprise nitride or polysilicon, etch stop layer 19 is first formed upon upper surface 12 of semiconductor substrate 10 and upon gate conductors 16 and 18. Etch stop layer 19 is preferably formed by thermal oxidation. Thus, etch stop layer 19 comprises oxide formed upon and within poly-crystalline and single-crystalline silicon. Etch stop layer 19 ensures etch selectivity between the subsequently formed spacers and the etch stop layer during removal of the spacers at a later stage of the present process set forth below. Etch stop layer 19 is omitted from subsequent figures for the sake of brevity. However, it is understood that layer 19 is nonetheless present, especially if the spacers are formed from nitride or polysilicon.

Figure 2:
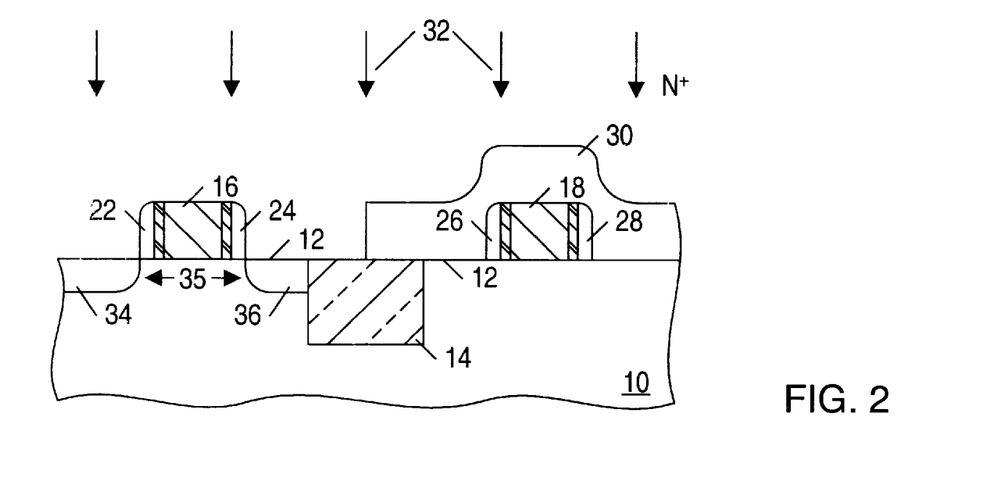
FIG. 2 is a partial cross-sectional view of a semiconductor topography according to a processing step subsequent to FIG. 1 in which a first concentration of an n-type species (N+ source/drain) is implanted into the semiconductor topography a spaced distance only from the first channel area.

Turning now to FIG. 2, a step subsequent to FIG. 1 is shown in which photoresist layer 30 is deposited upon the semiconductor topography. Photoresist layer 30 is then patterned in such a way as to expose gate conductor 16 and part of upper surface 12 on opposing sides of gate conductor 16 Photoresist layer 30 exposes a portion of the active region of semiconductor substrate 10 where the NMOS type transistors will be formed. A first concentration of n-type dopants 32 is then introduced into gate conductor 16 and source/drain regions 34 and 36 a spaced distance from first channel area 35 due to the existence of spacers 22 and 24. N$^+$ dopants 32 preferably comprise arsenic ions introduced by a high-current implanter at a dose somewhere near $5 \times 10^{15}$ cm$^{-2}$ and at energies of 10–80 keV, for example.

Figure 3:
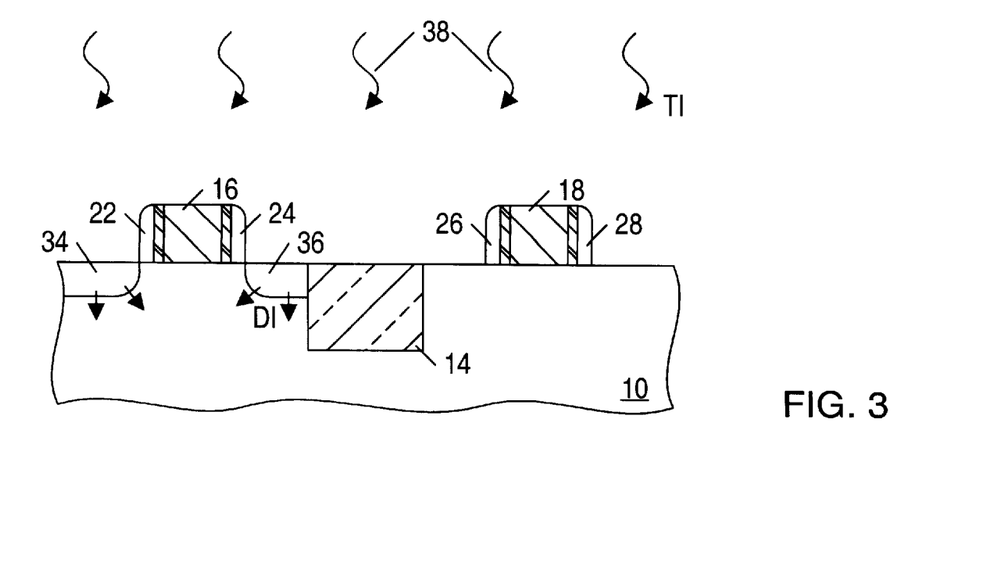
FIG. 3 is a partial cross-sectional view of a semiconductor topography according to a processing step subsequent to FIG. 2 in which a thermal anneal is performed at a first temperature.

Turning now to FIG. 3, a step subsequent to FIG. 2 is shown in which photoresist layer 30 is removed and the wafer is thermally annealed. Thermal anneal 38 is performed in an RTA chamber. The wafers are preferably annealed for approximately 10–30 seconds at a temperature $T_1$ of approximately 950–1050° C. In an alternative embodiment, thermal anneal 38 may be performed in a conventional furnace. Thermal anneal 38 is performed to activate and to diffuse gate and source/drain N$^+$ implants. Arsenic is a large ion with a low diffusion constant and, therefore, requires relatively high temperatures to migrate. In addition, a high temperature thermal anneal is required due to the higher dopant concentration used for the source/drain implant. More energy is needed to diffuse a higher number of ions. Therefore, an advantage hereof is to perform such a high temperature anneal step early in the process cycle, before implanting species with higher diffusivities in subsequent processing steps.

Figure 4:
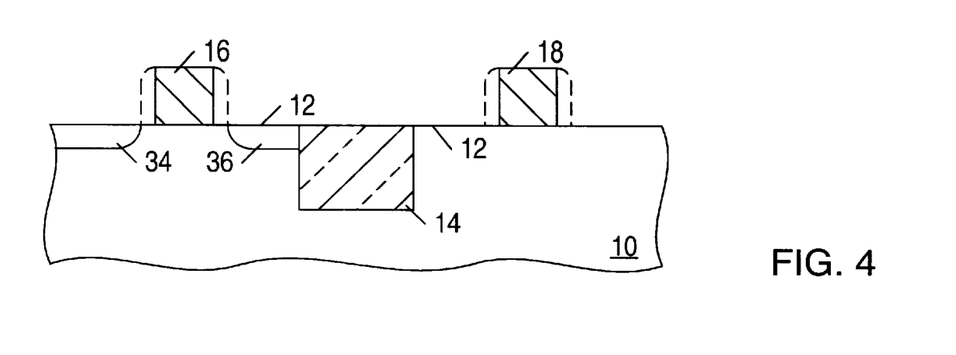
FIG. 4 is a partial cross-sectional view of a semiconductor topography according to a processing step subsequent to FIG. 3 in which the spacers on the opposed sidewall surfaces of both the first and second gate conductors are removed.

Turning now to FIG. 4, a step subsequent to FIG. 3 is shown in which dielectric spacers 22, 24, 26, 28 on the opposed sidewall surfaces of first and second gate conductors 16 and 18 are removed. Depending on the dielectric material used to form the spacers, the appropriate selective etch is used for their removal. If the spacers comprise silicon dioxide, hydrofluoric acid is preferably used; if the spacers comprise polysilicon, a combination of nitric acid and hydrofluoric acid is preferably used; and, if the spacers comprise silicon nitride, phosphoric acid is preferably used. Alternatively, a plasma (dry) etch may be used to remove the spacers. The spacers are removed from the gate conductors of both the NMOS and PMOS type transistors. The spacers are removed to enable n-type and p-type LDD implants substantially adjacent the gate conductors as set forth below.

Figure 5:
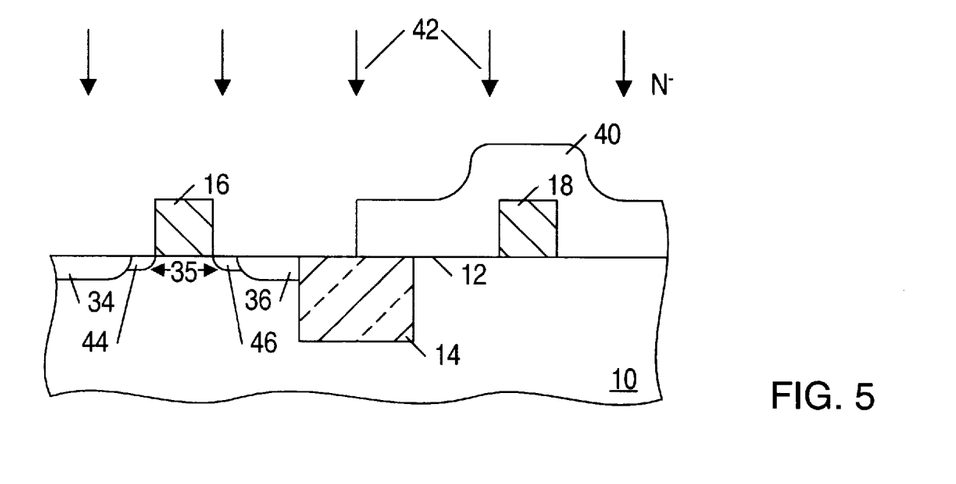
FIG. 5 is a partial cross-sectional view of a semiconductor topography according to a processing step subsequent to FIG. 4 in which a second concentration of an n-type species (N− LDD) is implanted into the semiconductor topography substantially adjacent to the first channel area.

Turning now to FIG. 5, a step subsequent to FIG. 4 is shown in which photoresist layer 40 is deposited upon the semiconductor topography. Photoresist layer 40 is then patterned in such a way as to expose gate conductor 16 and part of upper surface 12 on opposing sides of gate conductor 16. Photoresist layer 40 is patterned using the same mask used to pattern photoresist layer 30. The portion of semiconductor substrate 10 where NMOS transistors will be formed is now exposed. A second concentration of n-type dopants 42 is then introduced into gate conductor 16 and LDD areas 44 and 46 substantially adjacent to channel area 35 due to the absence of spacers 22 and 24. N$^-$ dopants 42 preferably comprise phosphorus ions introduced by a low-current implanter at a dose somewhere near $5 \times 10^{13}$ cm$^{-2}$ and at energies of 10–60 keV, for example.

Figure 6:
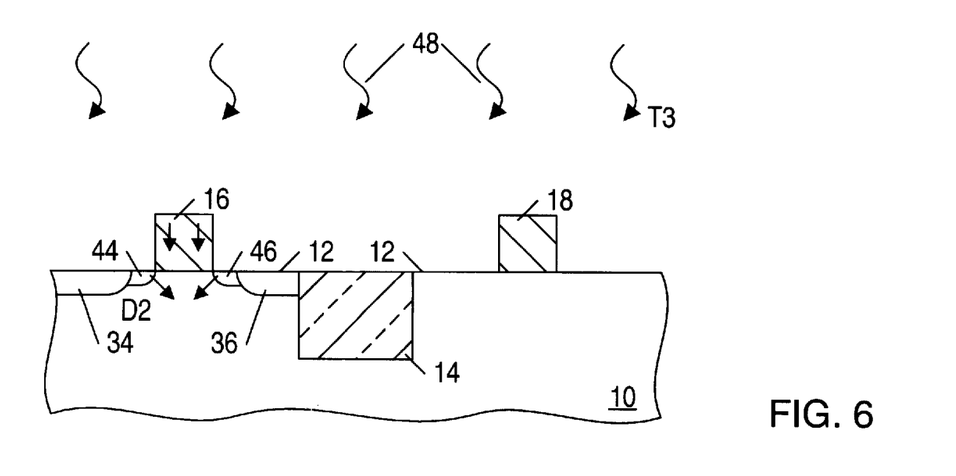
FIG. 6 is a partial cross-sectional view of a semiconductor topography according to a processing step subsequent to FIG. 5 in which an optional thermal anneal at a third temperature less than the first temperature is performed on the semiconductor topography.

Turning now to FIG. 6, a step subsequent to FIG. 5 is shown in which photoresist layer 40 is removed and then an optional thermal anneal is performed. Thermal anneal 48 may be performed to activate and position the second concentration of n-type phosphorus ions. Optional thermal anneal 48 may be performed at a third temperature $T_3$ which is less than first temperature $T_1$. Phosphorus is a smaller ion with a higher diffusivity than arsenic and thus requires lower temperatures to migrate the same distance. The already implanted and activated arsenic ions are not affected much by the lower temperature thermal anneal because of their much lower diffusivity.

Figure 7:
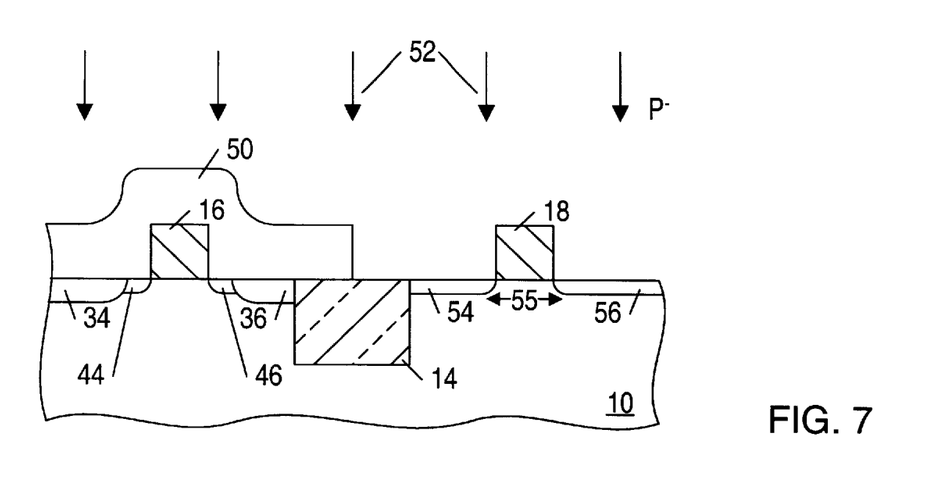
FIG. 7 is a partial cross-sectional view of a semiconductor topography according to a processing step subsequent to FIG. 6 in which a third concentration of a p-type (P− LDD) species is implanted into the semiconductor topography substantially adjacent to the second channel area.

Turning now to FIG. 7, a step subsequent to FIG. 6 is shown in which photoresist layer 50 is deposited upon the semiconductor topography. Photoresist layer 50 is then patterned in such a way as to expose gate conductor 18 and part of upper surface 12 on opposing sides of gate conductor 18. Photoresist layer 50 is patterned using a mask which is the reverse of the masks used to pattern photoresist layers 30 and 40. The portion of the active region of semiconductor substrate 10 where PMOS transistors will be formed is now exposed. A third concentration of p-type dopants 52 is then introduced into gate conductor 18 and LDD areas 54 and 56 substantially adjacent to channel area 55 due to the absence of spacers 26 and 28. P$^-$ dopants 52 preferably comprise boron ions introduced by a low-current implanter at a dose somewhere near $5 \times 10^{13}$ cm$^{-2}$ and at energies of 10–50 keV, for example.

Figure 8:
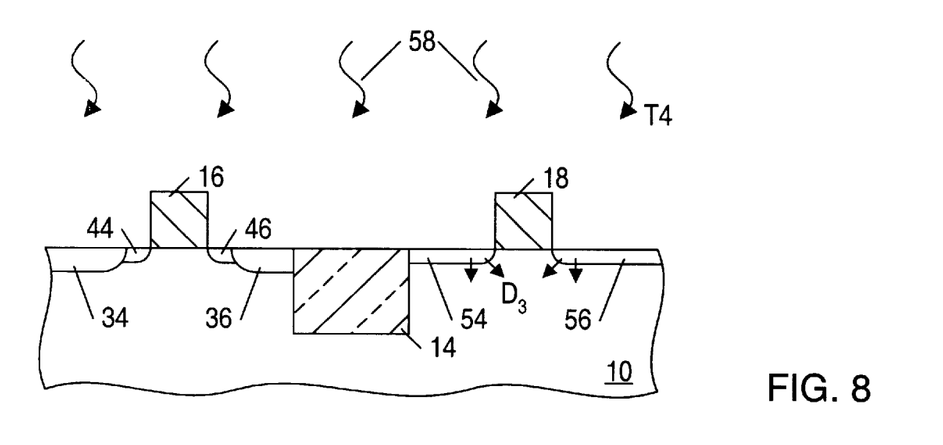
FIG. 8 is a partial cross-sectional view of a semiconductor topography according to a processing step subsequent to FIG. 7 in which an optional thermal anneal at a fourth temperature less than the third temperature is performed on the semiconductor topography.

Turning now to FIG. 8, a step subsequent to FIG. 7 is shown in which photoresist layer 50 is removed and then an optional thermal anneal is performed. Thermal anneal 58 is performed to activate the gate and LDD boron implants and to diffuse them into position. Optional thermal anneal 58 may be performed at a fourth temperature $T_4$ which is less than third temperature $T_3$. Boron is a relatively small ion with a high diffusion constant and, therefore, requires relatively low temperatures to be activated and to migrate to its desired location. The pre-existing arsenic N$^+$ source/drain implant and phosphorus N$^-$ LDD implant have a lower diffusivity and are not affected much by the lower temperature anneal.

Figure 9:
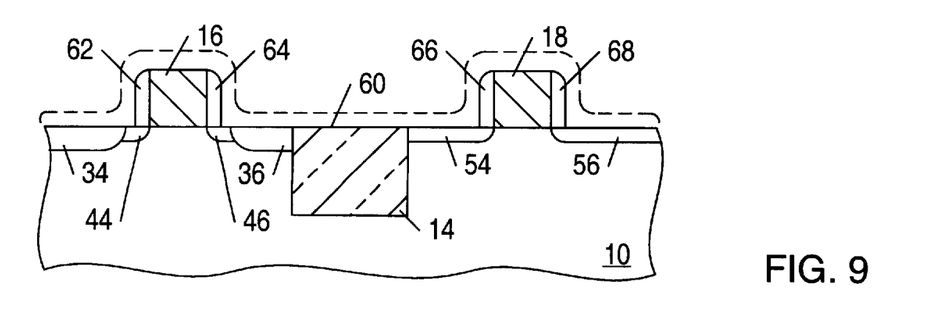
FIG. 9 is a partial cross-sectional view of a semiconductor topography according to a processing step subsequent to FIG. 8 in which spacers are formed on the opposed sidewall surfaces of the first and second gate conductors.

Turning now to FIG. 9, a step subsequent to FIG. 8 is shown in which conformal dielectric layer 60 is deposited upon the semiconductor topography. In a preferred embodiment, conformal dielectric layer 60 comprises decomposed TEOS at 400° C. deposited by CVD. This produces a film with excellent conformality with a thicker film at the edge of the gate-to-active area step than on the flat areas. Thus, an anisotropic etch removes the oxide in the substantially horizontal regions while leaving spacers on the sidewall surfaces of gate conductors 16 and 18. Oxide spacers 62 and 64 are formed on the sidewalls of gate conductor 16, and oxide spacers 66 and 68 are formed on the sidewalls of gate conductor 18. The spacers are formed on the gate conductors of both the NMOS and PMOS type transistors. The spacers are formed to enable p-type source/drain implants to be formed a spaced distance from the gate conductor as set forth below. In addition, it is important to reform the spacers on the sidewall surfaces of the gate conductors because of the subsequent salicide formation. Silicide layers are formed upon the source/drain regions and the gate conductors using a self aligned process. The silicide layers are formed only where there is exposed silicon. If the spacers are not reformed, silicide will form along the sidewall surfaces of gate conductors 16 and 18. An electrical short will then be established between the gate conductor and the source/drain regions adjacent them.

Figure 10:
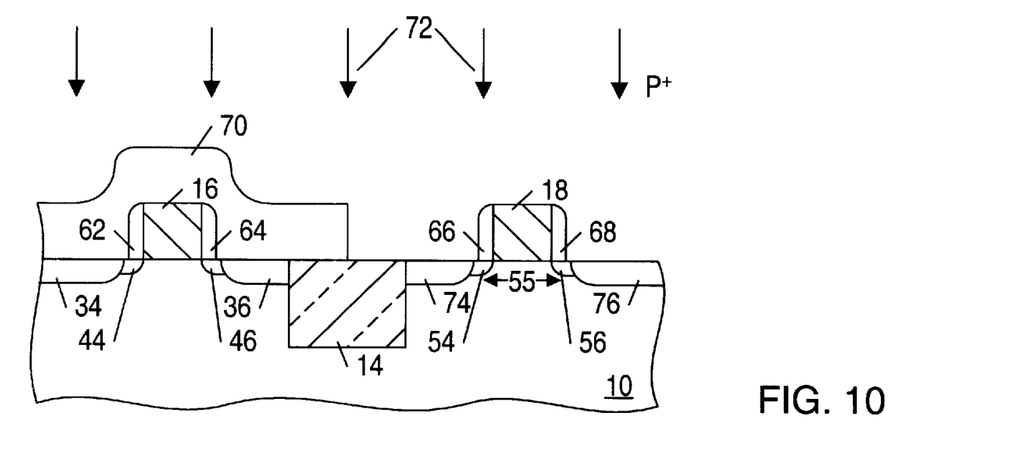
FIG. 10 is a partial cross-sectional view of a semiconductor topography according to a processing step subsequent to FIG. 9 in which a fourth p-type species (P+ source/drain) is implanted into the semiconductor topography a spaced distance from the second channel area.

Turning now to FIG. 10, a step subsequent to FIG. 9 is shown in which photoresist layer 70 is deposited upon the semiconductor topography. Photoresist layer 70 is then patterned in such a way as to expose gate conductor 18 and part of upper surface 12 on opposing sides of gate conductor 18. Photoresist layer 70 is patterned using a mask which is the same as the one used to pattern photoresist 50 and the reverse of the masks used to form photoresist layers 30 and photoresist layer 40. A fourth concentration of p-type dopants 72 is then introduced into gate conductor 18 and source/drain regions 74 and 76 a spaced distance from first channel area 55 due to masking incurred by spacers 66 and 68. P$^+$ dopants 72 preferably comprise boron ions introduced by a high-current implanter at a dose somewhere near $10^{15}$ cm$^{-2}$ and at energies of 10–70 keV, for example.

Figure 11:
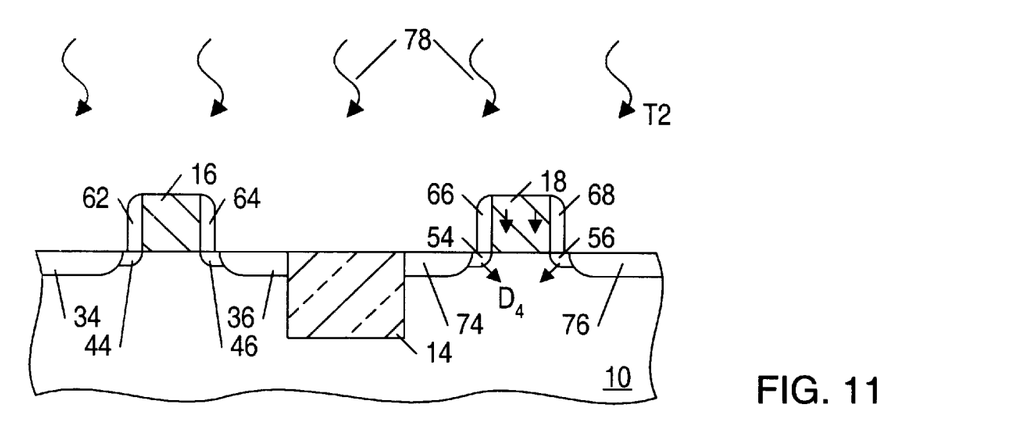
FIG. 11 is a partial cross-sectional view of a semiconductor topography according to a processing step subsequent to FIG. 10 in which a thermal anneal at a second temperature less than the first temperature is performed on the semiconductor topography.

Turning now to FIG. 11, a step subsequent to FIG. 10 is shown in which photoresist layer 70 is removed and then a thermal anneal is performed. Thermal anneal 78 may be performed to activate and position the fourth concentration of p-type boron ions. The thermal anneal is performed at a second temperature $T_2$ which is less than first temperature $T_1$ and, furthermore, less than optional thermal anneal third temperature $T_3$. Boron is a smaller ion with a higher diffusivity than arsenic and thus requires lower temperatures to migrate the same distance. The already implanted and activated arsenic and phosphorus ions are not affected much by the lower temperature thermal anneal because of their lower diffusivity. Furthermore, the thermal anneal must be performed at a temperature low enough so as to not induce excessive diffusion to the pre-existing boron ions in the LDD region. Lateral migration of the boron ions towards the channel will shorten the channel length and cause harmful short-channel effects.

Figure 12:
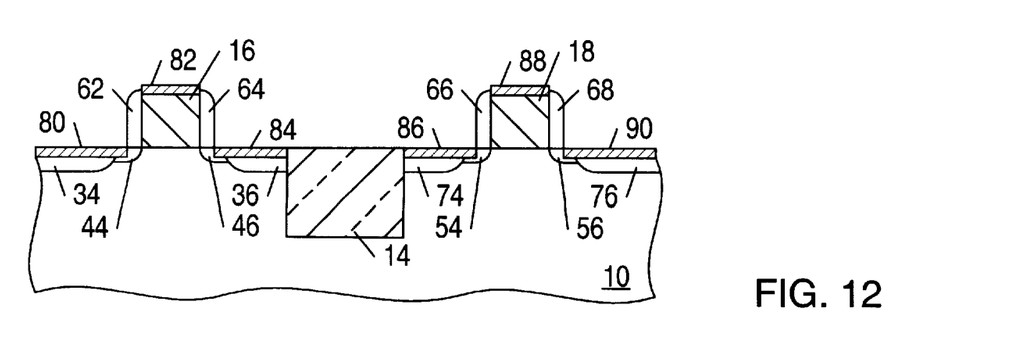
FIG. 12 is a partial cross-sectional view of a semiconductor topography according to a processing step subsequent to FIG. 11 in which salicide is formed upon exposed silicon-based first and second gate conductors and source/drain areas adjacent to the first and second conductors.

Turning now to FIG. 12, a step subsequent to FIG. 11 is shown in which salicide layers 80, 82, 84, 86, 88, and 90 are formed upon gate conductors 16 and 18 and source/drain areas 34, 36, 74, and 76. A refractory metal such as titanium, platinum, cobalt, molybdenum, tantalum, or tungsten is deposited upon the semiconductor topography. Titanium is usually preferred because of its relatively low contact resistivity. The wafer is then heated (or annealed—possibly in two steps) which causes silicide formation at the silicon/metal interface. The metal only reacts wherever it is in contact with silicon and generally not anywhere else. The unreacted metal is then selectively removed through the use of an etchant that does not attack the salicide, the silicon, or the silicon oxide layers. As a result the formerly exposed silicon is now completely covered with silicide, but the rest of the wafer is not. Due to the presence of the oxide spacers along the sidewall surfaces of the gate conductors no silicide is formed there.

It will be appreciated to those skilled in the art having the benefit of this disclosure that this invention is believed to be capable of forming an LDD structure using a reverse process flow such that higher temperature anneals are performed first to prevent migration of dopants with high diffusivity. Furthermore, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such modifications and changes.

What is claimed is:

1. A method for forming an integrated circuit, comprising in sequence:
   providing a first gate conductor laterally spaced from a second gate conductor upon respective first and second channel areas of a semiconductor topography;
   patterning a spacer dielectric upon opposed sidewall surfaces of said first and second gate conductors;
   implanting an n-type species of a first concentration into said semiconductor topography a spaced distance from only said first channel area;
   removing said spacer dielectric;
   annealing said semiconductor topography at a first temperature;
   implanting n-type species of a second concentration less than the first concentration into said semiconductor topography substantially adjacent only said first channel area;
   annealing said semiconductor topography at a second temperature less than said first temperature;
   implanting a p-type species of a third concentration into said semiconductor topography substantially adjacent only said second channel area;
   annealing said semiconductor topography at a third temperature less than said first and second temperatures;
   re-patterning another spacer dielectric upon opposed sidewall surfaces of said first and second gate conductors;
   implanting p-type species of a fourth concentration greater than the third concentration into said semiconductor topography a spaced distance from only said second channel area; and
   annealing said semiconductor topography at a fourth temperature less than said first and second temperatures.

2. The method as recited in claim 1, wherein said first and second gate conductors are patterned from a layer of polycrystalline silicon.

3. The method as recited in claim 1, wherein said patterning comprises:
   depositing a dielectric material across said first and second gate conductors; and
   removing said dielectric material except upon sidewall surfaces of said first and second gate conductors.

4. The method as recited in claim 1, wherein said n-type species of said first concentration comprises arsenic, and wherein said n-type species of said second concentration comprises phosphorous.

5. The method as recited in claim 1, wherein said p-type species of said third and fourth concentrations comprise boron.

6. The method as recited in claim 1, wherein said spacer dielectric comprises nitride patterned upon a thermally grown oxide, and wherein removing comprises stripping said nitride from said oxide.

7. The method as recited in claim 1, further comprising forming an etch stop layer upon said semiconductor topography and said opposed sidewall surfaces of said first and second gate conductors prior to patterning said spacer dielectric.

8. The method as recited in claim 1, wherein said re-patterning comprises:
   depositing a dielectric material across said first and second gate conductors; and
   removing said dielectric material except upon sidewall surfaces of said first and second gate conductors.

9. A method for forming an integrated circuit, comprising in sequence:
   implanting a spaced distance from opposing sidewall surfaces of a first gate conductor n-type source and drain areas within a semiconductor substrate;
   annealing the semiconductor substrate at a first temperature;
   implanting substantially adjacent the opposing sidewall surfaces of the first gate conductor n-type lightly doped drain areas within the semiconductor substrate;
   annealing the semiconductor substrate at a second temperature less than the first temperature;
   implanting substantially adjacent opposing sidewall surfaces of a second gate conductor p-type lightly doped drain areas within the semiconductor substrate, wherein said second gate conductor is laterally spaced from said first gate conductor;
   annealing the semiconductor substrate at a third temperature less than the first and second temperatures;

implanting a spaced distance from the opposing sidewall surfaces of the second gate conductor p-type source and drain areas within the semiconductor substrate; and     annealing the semiconductor substrate at a fourth temperature less than the first and second temperatures.

10. The method as recited in claim 9, wherein implanting said n-type source and drain areas comprises implanting n-type dopants of a first concentration into said n-type source and drain areas.

11. The method as recited in claim 10, wherein implanting said n-type lightly doped drain areas comprises implanting n-type dopants of a second concentration less than the first concentration into said n-type lightly doped drain areas.

12. The method as recited in claim 9, wherein implanting said p-type source and drain areas comprises implanting p-type dopants of a first concentration into said p-type source and drain areas.

13. The method as recited in claims 12, wherein implanting said p-type lightly doped drain areas comprises implanting p-type dopants of a second concentration greater than the first concentration into said p-type lightly doped drain areas.

\* \* \* \* \*